(12) United States Patent
Cui et al.

(10) Patent No.: US 11,043,151 B2
(45) Date of Patent: Jun. 22, 2021

(54) SURFACE TREATED ABRASIVE PARTICLES FOR TUNGSTEN BUFF APPLICATIONS

(71) Applicant: Cabot Microelectronics Corporation, Aurora, IL (US)

(72) Inventors: Ji Cui, Aurora, IL (US); Helin Huang, Aurora, IL (US); Kevin P. Dockery, Aurora, IL (US); Pankaj K. Singh, Plainfield, IL (US); Hung-Tsung Huang, Tainan (TW); Chih-Hsien Chien, Kaohsiung (TW)

(73) Assignee: CMC Materials, Inc., Aurora, IL (US)

( * ) Notice: Subject to any disclaimer, the term of this patent is extended or adjusted under 35 U.S.C. 154(b) by 0 days.

(21) Appl. No.: 15/723,886

(22) Filed: Oct. 3, 2017

(65) Prior Publication Data

US 2019/0100677 A1    Apr. 4, 2019

(51) Int. Cl.
| | |
|---|---|
| *C09G 1/02* | (2006.01) |
| *H01L 21/768* | (2006.01) |
| *H01L 21/321* | (2006.01) |
| *H01L 21/3105* | (2006.01) |
| *G09G 1/02* | (2006.01) |

(52) U.S. Cl.
CPC ......... *G09G 1/02* (2013.01); *H01L 21/31053* (2013.01); *H01L 21/3212* (2013.01); *H01L 21/7684* (2013.01)

(58) Field of Classification Search
CPC . C09G 1/02; H01L 21/7684; H01L 21/31053; H01L 21/3212
See application file for complete search history.

(56) References Cited

U.S. PATENT DOCUMENTS

| 6,821,897 | B2 | 11/2004 | Schroeder et al. |
|---|---|---|---|
| 8,425,797 | B2 | 4/2013 | Brusic et al. |
| 8,623,766 | B2 | 1/2014 | Cui et al. |
| 8,906,252 | B1 | 12/2014 | Dockery et al. |
| 9,343,330 | B2 | 5/2016 | Brusic et al. |
| 2004/0209555 | A1* | 10/2004 | Sun .......... C09G 1/02 451/41 |
| 2010/0075502 | A1* | 3/2010 | Li .......... H01L 21/3212 438/693 |
| 2015/0218709 | A1* | 8/2015 | Yoshizaki .......... C09K 3/1436 252/79.2 |
| 2015/0368515 | A1 | 12/2015 | Lu et al. |
| 2016/0108286 | A1* | 4/2016 | Sikma .......... C09G 1/02 216/53 |
| 2016/0358790 | A1 | 12/2016 | Shi et al. |

OTHER PUBLICATIONS

Korean Intellectual Property Office Acting as ISA, International Search Report and Written Opinion of the International Searching Authority issued in connection with Application No. PCT/US2018/054079 dated Feb. 1, 2019.

\* cited by examiner

*Primary Examiner* — Nadine G Norton
*Assistant Examiner* — Mahmoud Dahimene
(74) *Attorney, Agent, or Firm* — Thomas Omholt; Erika R. Singleton; Francis J. Koszyk

(57) ABSTRACT

The invention provides a chemical-mechanical polishing composition comprising (a) an abrasive selected from the group consisting of alumina, ceria, titania, zirconia, and combinations thereof, wherein the abrasive is surface-coated with a copolymer comprising a combination of sulfonic acid monomeric units and carboxylic acid monomeric units a combination of sulfonic acid monomeric units and phosphonic acid monomeric units, (b) an oxidizing agent, and (c) water, wherein the polishing composition has a pH of about 2 to about 5. The invention further provides a method of chemically-mechanically polishing a substrate with the inventive chemical-mechanical polishing composition. Typically, the substrate comprises tungsten or cobalt and silicon oxide.

19 Claims, 3 Drawing Sheets

SURFACE TREATED ABRASIVE PARTICLES FOR TUNGSTEN BUFF APPLICATIONS

BACKGROUND OF THE INVENTION

Chemical mechanical polishing (CMP) compositions and methods for polishing (or planarizing) the surface of a substrate are well known in the art. Polishing compositions (also known as polishing slurries, CMP slurries, and CMP compositions) for polishing metal layers (such as tungsten) on a semiconductor substrate may include abrasive particles suspended in an aqueous solution and chemical accelerators such as oxidizers, chelating agents, catalysts, and the like.

In a conventional CMP operation, the substrate (wafer) to be polished is mounted on a carrier (polishing head) which is in turn mounted on a carrier assembly and positioned in contact with a polishing pad in a CMP apparatus (polishing tool). The carrier assembly provides a controllable pressure to the substrate, pressing the substrate against the polishing pad. The substrate and pad are moved relative to one another by an external driving force. The relative motion of the substrate and pad abrades and removes a portion of the material from the surface of the substrate, thereby polishing the substrate. The polishing of the substrate by the relative movement of the pad and the substrate may be further aided by the chemical activity of the polishing composition (e.g., by an oxidizing agent and other chemical compounds present in the CMP composition) and/or the mechanical activity of an abrasive suspended in the polishing composition.

In typical tungsten plug and interconnect processes, tungsten is deposited over a dielectric and within openings formed therein. The excess tungsten over the dielectric layer is then removed during a CMP operation to form tungsten plugs and interconnects within the dielectric. Following bulk tungsten removal, the substrate surface can be subjected to a buff polishing step to remove debris and to provide a more uniform topology to the surface. The buff polishing is demanding in that erosion within substrate features such as the tungsten plugs and interconnects, which is excessive metal removal from within the features leading to nonplanarity, must be minimized or more preferably even reversed. The buffing step involves polishing of two or more different materials, such as tungsten, dielectric, and also barrier materials such as silicon nitride, and thus requires a proper balance of the removal rates of the different materials to achieve suitable surface topography.

Accordingly, there is an ongoing need to develop new polishing methods and compositions for tungsten buffing applications that provide good surface topography and planarity while minimizing or reversing erosion.

BRIEF SUMMARY OF THE INVENTION

The invention provides a chemical-mechanical polishing composition comprising (a) an abrasive selected from the group consisting of ceria, titania, zirconia, and combinations thereof, wherein the abrasive is surface-coated with a copolymer comprising a combination of sulfonic acid monomeric units and carboxylic acid monomeric units, or wherein the abrasive is surface-coated with a copolymer comprising a combination of sulfonic acid monomeric units and phosphonic acid monomeric units, (b) an oxidizing agent, and (c) water, wherein the polishing composition has a pH of about 2 to about 5.

The invention also provides a chemical-mechanical polishing composition comprising (a) an alumina abrasive, wherein the alumina is surface-coated with a copolymer comprising a combination of sulfonic acid monomeric units and carboxylic acid monomeric units, or wherein the alumina is surface-coated with a copolymer comprising a combination of sulfonic acid monomeric units and phosphonic acid monomeric units, (b) an oxidizing agent, (c) an organic phosphonic acid, and (d) water, wherein the polishing composition has a pH of about 2 to about 5.

The invention further provides a method of chemically mechanically polishing a substrate comprising (i) providing a substrate, (ii) providing a polishing pad, (iii) providing a chemical-mechanical polishing composition comprising (a) an abrasive selected from the group consisting of alumina, ceria, titania, zirconia, and combinations thereof, wherein the abrasive is surface-coated with a copolymer comprising a combination of sulfonic acid monomeric units and carboxylic acid monomeric units, or wherein the abrasive is surface-coated with a copolymer comprising a combination of sulfonic acid monomeric units and phosphonic acid monomeric units, (b) an oxidizing agent, and (c) water, wherein the polishing composition has a pH of about 2 to about 5, (iv) contacting the substrate with the polishing pad and the chemical-mechanical polishing composition, and (v) moving the polishing pad and the chemical mechanical polishing composition relative to the substrate to abrade at least a portion of the substrate to polish the substrate.

BRIEF DESCRIPTION OF THE SEVERAL VIEWS OF THE DRAWING(S)

DETAILED DESCRIPTION OF THE INVENTION

Figure 1:
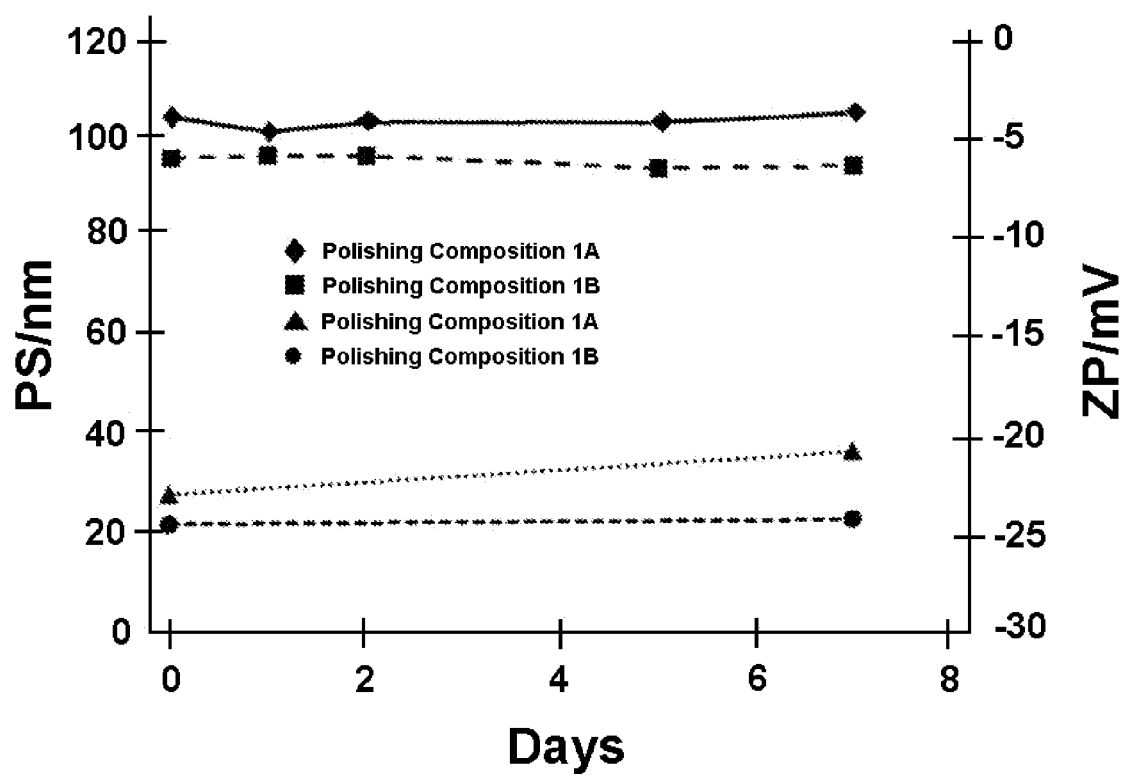
FIG. 1 shows the particle size and zeta potential of polishing compositions comprising surface-coated zirconia and hydrogen peroxide as a function of time, in accordance with an embodiment of the invention.

The invention provides a chemical-mechanical polishing composition comprising, consisting essentially of, or consisting of (a) an abrasive selected from the group consisting of ceria, titania, zirconia, and combinations thereof, wherein the abrasive is surface-coated with a copolymer comprising a combination of sulfonic acid monomeric units and carboxylic acid monomeric units, or wherein the abrasive is surface-coated with a copolymer comprising a combination of sulfonic acid monomeric units and phosphonic acid monomeric units, (b) an oxidizing agent, and (c) water, wherein the polishing composition has a pH of about 2 to about 5.

In another embodiment, the invention provides a chemical-mechanical polishing composition comprising, consisting essentially of, or consisting of (a) an alumina abrasive, wherein the alumina is surface-coated with a copolymer comprising a combination of sulfonic acid monomeric units and carboxylic acid monomeric units, or wherein the alumina is surface-coated with a copolymer comprising a combination of sulfonic acid monomeric units and phosphonic acid monomeric units, (b) an oxidizing agent, (c) an organic phosphonic acid, and (d) water, wherein the polishing composition has a pH of about 2 to about 5.

The polishing composition comprises an abrasive selected from the group consisting of alumina, ceria, titania, zirconia, and a combination thereof, wherein the abrasive is surface-coated with a copolymer comprising a combination of sulfonic acid monomeric units and carboxylic acid monomeric units, or wherein the abrasive is surface-coated with a copolymer comprising a combination of sulfonic acid monomeric units and phosphonic acid monomeric units. The abrasive comprises abrasive particles that can have any suitable average size (i.e., average particle diameter). The average particle diameter refers to the weight average particle size ($D_w$), as will be understood by those of ordinary skill in the art. If the average particle size of the abrasive particles is too small, the polishing composition may not exhibit sufficient removal rate. In contrast, if the average particle size of the abrasive particles is too large, the polishing composition may exhibit undesirable polishing performance such as, for example, poor substrate defectivity. Accordingly, the abrasive particles can have an average particle size of about 10 nm or more, for example, about 15 nm or more, about 20 nm or more, about 30 nm or more, about 40 nm or more, about 50 nm or more, about 60 nm or more, about 70 nm or more, about 80 nm or more, about 90 nm or more, or about 100 nm or more. Alternatively, or in addition, the abrasive particles can have an average particle size of about 1,000 nm or less, for example, about 750 nm or less, about 500 nm or less, about 400 nm or less, about 300 nm or less, or about 200 nm or less. Thus, the abrasive particles can have an average particle size bounded by any two of the aforementioned endpoints. For example, the abrasive particles can have an average particle size of about 10 nm to about 1,000 nm, about 20 nm to about 750 nm, about 30 nm to about 500 nm, about 40 nm to about 400 nm, about 50 nm to about 300 nm, about 60 nm to about 300 nm, about 70 nm to about 300 nm, about 80 nm to about 300 nm, about 90 nm to about 300 nm, or about 100 nm to about 200 nm. The particle size of the abrasive particles can be measured using any suitable technique, for example, using laser diffraction techniques. Suitable particle size measurement instruments are available from, e.g., Malvern Instruments (Malvern, UK).

The polishing composition can comprise any suitable concentration of abrasive. If the polishing composition of the invention comprises too little abrasive, the composition may not exhibit sufficient removal rate. In contrast, if the polishing composition comprises too much abrasive, the composition may exhibit undesirable polishing performance, may cause surface defects such as scratches, may not be cost effective, and/or may lack stability. The polishing composition can comprise about 10 wt. % or less of abrasive, for example, about 9 wt. % or less, about 8 wt. % or less, about 7 wt. % or less, about 6 wt. % or less, or about 5 wt. % or less. Alternatively, or in addition, the polishing composition can comprise about 0.1 wt. % or more of abrasive, for example, about 0.2 wt. % or more, about 0.3 wt. % or more, about 0.4 wt. % or more, about 0.5 wt. % or more, or about 1 wt. % or more. Thus, the polishing composition can comprise abrasive in a concentration bounded by any two of the aforementioned endpoints. For example, the polishing composition can comprise about 0.1 wt. % to about 10 wt. % of abrasive, e.g., about 0.1 wt. % to about 9 wt. % of abrasive, about 0.1 wt. % to about 8 wt. % of abrasive, about 0.1 wt. % to about 7 wt. % of abrasive, about 0.1 wt. % to about 6 wt. % of abrasive, about 0.1 wt. % to about 5 wt. % of abrasive, about 0.1 wt. % to about 5 wt. % of abrasive, about 0.2 wt. % to about 5 wt. % of abrasive, about 0.3 wt. % to about 5 wt. % of abrasive, about 0.4 wt. % to about 5 wt. % of abrasive, about 0.5 wt. % to about 5 wt. % of abrasive, about 0.6 wt. % to about 5 wt. % of abrasive, about 0.7 wt. % to about 5 wt. % of abrasive, about 0.8 wt. % to about 5 wt. % of abrasive, about 0.9 wt. % to about 5 wt. % of abrasive, or about 1 wt. % to about 5 wt. % of abrasive.

Typically, the abrasive comprises cationic abrasive particles. Preferably, the abrasive particles have an isoelectric point at a pH of ≥4 and more preferably, at a pH of ≥6. Desirably, the abrasive particles are positively charged at the pH of the polishing composition.

The polishing composition comprises a copolymer comprising or consisting of a combination of sulfonic acid monomeric units and carboxylic acid monomeric units or a combination of sulfonic acid monomeric units and phosphonic acid monomeric units, referred to herein as "copolymer." Preferably, the copolymer consists of a combination of sulfonic acid monomeric units and carboxylic acid monomeric units or a combination of sulfonic acid monomeric units and phosphonic acid monomeric units. The copolymer can be any suitable copolymer comprising or consisting of a combination of sulfonic acid monomeric units and carboxylic acid monomeric units or a combination of sulfonic acid monomeric units and phosphonic acid monomeric units. Non-limiting examples of suitable sulfonic acid monomeric units include 2-acrylamido-2-methyl-1-propanesulfonic acid (AMPS), 4-vinylbenzenesulfonic acid, vinyl sulfonic acid, 2-sulfoethyl acrylate, 2-sulfoethyl methacrylate, 3-sulfopropyl acrylate, 3-sulfopropyl methacrylate, sodium styrene sulfonate, and 2-propene-1-sulfonic acid, and salts thereof, combinations thereof, and the like. Non-limiting examples of suitable carboxylic acid monomers include acrylic acid, methacrylic acid, maleic acid, succinic acid, terephthalic acid, aspartic acid, combinations thereof, and the like. Non-limiting examples of suitable phosphonic acid monomers include di- or polyphosphonic acids having one or more unsaturated C═C bonds such as vinylidene-1,1-diphosphonic acid), dimethyl-p-vinylbenzylphosphonate, vinylphosphonic acid, ammonium bisdiethylphosphonate (meth)acrylate, acrylamide phosphonate monomers, combinations thereof, and the like. It is not necessary that the copolymer is produced by copolymerization of a combination of sulfonic acid monomeric units and carboxylic acid monomeric units or a combination of sulfonic acid monomeric units and phosphonic acid monomeric units. It is also contemplated that suitable copolymers can be prepared by post-polymerization processing of precursor copolymers followed by conversion of the copolymers into copolymers having a combination of sulfonic acid monomeric units and carboxylic acid monomeric units or sulfonic acid monomeric units and phosphonic acid monomeric units. Preferably, the copolymer does not comprise acrylic ester monomeric units or monomeric units comprising aryl groups.

The copolymer can be a random copolymer or a block copolymer. In a preferred embodiment, the copolymer is a random copolymer.

The copolymer can have any suitable molecular weight. The copolymer can have an average molecular weight of about 500 g/mol or more, for example, about 1,000 g/mol or more, about 2,000 g/mol or more, about 3,000 g/mol or more, about 4,000 g/mol or more, about 5,000 g/mol or more, about 6,000 g/mol or more, about 7,000 g/mol or more, about 8,000 g/mol or more, about 9,000 g/mol or more, about 10,000 g/mol or more, about 15,000 g/mol or more, about 20,000 g/mol or more, about 40,000 g/mol or more, or about 50,000 g/mol or more. Alternatively, or in addition, the copolymer can have an average molecular weight of about 100,000 g/mol or less, for example, about 95,000 g/mol or less, about 90,000 g/mol or less, about 85,000 g/mol or less, about 80,000 g/mol or less, about 75,000 g/mol or less, about 70,000 g/mol or less, about 65,000 g/mol or less, about 60,000 g/mol or less, about 55,000 g/mol or less, or about 50,000 g/mol or less. Thus, the copolymer can have an average molecular weight bounded by any two of the aforementioned endpoints. For example, the copolymer can have an average molecular weight of about 1,000 g/mol to about 100,000 g/mol, about 1,000 g/mol to about 90,000 g/mol, about 1,000 g/mol to about 80,000 g/mol, about 1,000 g/mol to about 70,000 g/mol, about 1,000 g/mol to about 60,000 g/mol, about 1,000 g/mol to about 50,000 g/mol, about 2,000 g/mol to about 50,000 g/mol, about 3,000 g/mol to about 50,000 g/mol, about 4,000 g/mol to about 50,000 g/mol, or about 5,000 g/mol to about 50,000 g/mol.

The polishing composition comprises any suitable amount of the copolymer. The amount of copolymer refers to the total amount of copolymer present in the polishing composition. The polishing composition can comprise about 1 ppm or more of the copolymer, for example, about 5 ppm or more, about 10 ppm or more, about 20 ppm or more, about 30 ppm or more, about 40 ppm or more, or about 50 ppm or more. Alternatively, or in addition, the polishing composition can comprise about 500 ppm or less of the copolymer, for example, about 450 ppm or less, about 400 ppm or less, about 350 ppm or less, about 300 ppm or less, about 250 ppm or less, about 200 ppm or less, about 150 ppm or less, or about 100 ppm or less. Thus, the polishing composition can comprise the copolymer in an amount bounded by any two of the aforementioned endpoints. For example, the polishing composition can comprise about 1 ppm to about 500 ppm of the copolymer, e.g., about 5 ppm to about 450 ppm, about 10 ppm to about 400 ppm, about 10 ppm to about 350 ppm, about 10 ppm to about 300 ppm, about 10 ppm to about 250 ppm, about 10 ppm to about 200 ppm, about 10 ppm to about 100 ppm, about 10 ppm to about 90 ppm, about 10 ppm to about 80 ppm, about 10 ppm to about 70 ppm, about 10 ppm to about 60 ppm, about 10 ppm to about 50 ppm, about 10 ppm to about 40 ppm, about 20 ppm to about 300 ppm, about 20 ppm to about 250 ppm, about 20 ppm to about 200 ppm, about 20 ppm to about 150 ppm, or about 20 ppm to about 100 ppm.

In another embodiment, the polishing composition comprises the copolymer in a concentration based on the weight of the abrasive in the polishing composition. For example, the polishing composition can contain about 0.01 wt. % or more of the copolymer, e.g., about 0.05 wt. % or more, about 0.1 wt. % or more, e.g., about 0.2 wt. % or more, about 0.3 wt. % or more, about 0.4 wt. % or more, about 0.5 wt. % or more, about 0.6 wt. % or more, about 0.7 wt. % or more, about 0.8 wt. % or more, about 0.9 wt. % or more, or about 1 wt. % or more, based on the weight of the abrasive in the polishing composition. Alternatively, or in addition, the polishing composition can contain about 5 wt. % or less of the copolymer, e.g., about 4.5 wt. % or less, about 4 wt. % or less, about 3.5 wt. % or less, about 3 wt. % or less, about 2.5 wt. % or less, or about 2 wt. % or less, based on the weight of the abrasive in the polishing composition. Thus, the polishing composition can comprise the copolymer in a weight ratio to abrasive bounded by any two of the aforementioned endpoints. For example, the polishing composition can contain about 0.01 wt. % to about 5 wt. % of the copolymer, e.g., about 0.05 wt. % to about 5 wt. %, about 0.1 wt. % to about 5 wt. %, about 0.2 wt. % to about 5 wt. %, about 0.3 wt. % to about 5 wt. %, about 0.4 wt. % to about 5 wt. %, about 0.5 wt. % to about 5 wt. %, about 0.5 wt. % to about 4.5 wt. %, about 0.5 wt. % to about 4 wt. %, about 0.5 wt. % to about 3.5 wt. %, about 0.5 wt. % to about 3 wt. %, about 0.6 wt. % to about 3 wt. %, about 0.7 wt. % to about 3 wt. %, about 0.8 wt. % to about 3 wt. %, about 0.9 wt. % to about 3 wt. %, or about 1 wt. % to about 3 wt. %, based on the weight of the abrasive in the polishing composition.

Desirably, the abrasive is surface-coated with the copolymer. Without wishing to be bound by any particular theory, it is believed that the abrasive is surface-coated with the copolymer via hydrogen bonding and/or via electrostatic interaction between the cationic abrasive particles and the copolymer. One non-limiting example of the copolymer surface coating the abrasive, is a copolymer consisting of 2 acrylamido 2 methylpropane sulfonic acid monomeric units and acrylic acid monomeric units. Additionally, the copolymer may, without limitation, have the 2 acrylamido 2 methylpropane sulfonic acid monomeric units and acrylic acid monomeric units in a molar ratio range of 10:1 to 1:10.

The abrasive can be surface-coated with the copolymer in any suitable manner. In an embodiment, the abrasive is treated with the copolymer, optionally in the presence of a solvent, prior to addition to the polishing composition. The abrasive can be surface-coated in water in a separate step to form a dispersion of surface-coated abrasive, and the resulting dispersion of surface-coated abrasive used to prepare the polishing composition. In some embodiments, the abrasive can be surface-coated in the absence of a solvent, or in the presence of a solvent other than the water of the polishing composition or in an additional solvent in combination with the water of the polishing composition. The additional solvent may be removed, for example, by azeotropic distillation to provide a dispersion of the surface-coated solvent in water substantially free of the additional solvent. In other embodiments, the surface-coated abrasive can be isolated as a substantially dry material, i.e., substantially free of any solvent, via filtration, centrifugation, spray drying, or any suitable technique, prior to use in the preparation of the polishing composition. In yet other embodiments, the surface-coated abrasive is formed in situ upon combination of the abrasive and the copolymer into the polishing composition. In a preferred embodiment, the surface-coated abrasive is formed by combining the abrasive and the copolymer in an aqueous medium having a pH equal to or less than the isoelectric point of the abrasive to form an aqueous dispersion of the abrasive and copolymer, and then subjecting the aqueous dispersion of the abrasive and copolymer to conditions so as to thoroughly mix the aqueous dispersion. In an embodiment, the aqueous dispersion is subjected to high shear mixing.

The surface-coated abrasive particles preferably are colloidally stable in the inventive polishing composition. The term colloid refers to the suspension of surface-coated abrasive particles in the liquid carrier (e.g., water). Colloidal stability refers to the maintenance of that suspension through time. In the context of this invention, a surface-coated abrasive is considered colloidally stable if, when the surface-coated abrasive is placed into a 100 mL graduated cylinder and allowed to stand unagitated for a time of 2 hours, the difference between the concentration of particles in the bottom 50 mL of the graduated cylinder ([B] in terms of g/mL) and the concentration of particles in the top 50 mL of the graduated cylinder ([T] in terms of g/mL) divided by the initial concentration of particles in the abrasive composition ([C] in terms of g/mL) is less than or equal to 0.5 (i.e., {[B]−[T]}/[C]≤0.5). More preferably, the value of [B]−[T]/[C] is less than or equal to 0.3, and most preferably is less than or equal to 0.1.

The polishing composition comprises an oxidizing agent. The oxidizing agent can be any suitable oxidizing agent. In certain embodiments, the oxidizing agent comprises ferric ion. The ferric ion can be provided by any suitable source of ferric ion. In some embodiments, the oxidizing agent can comprise a salt of the metal. For example, ferric ion can be provided by a ferric salt comprising inorganic anions such as nitrate ions (e.g., ferric nitrate), cyanide ions (e.g., ferricyanide anion), and the like. The oxidizing agent can also comprise ferric organic iron (III) compounds such as but not limited to acetates, acetylacetonates, citrates, gluconates, oxalates, phthalates, and succinates, and mixtures thereof. In other embodiments, the oxidizing agent can be an oxy-containing oxidizing agent. Non-limiting examples of suitable oxy-containing oxidizing agents include persulfate salts, bromate persulfate salts, iodate persulfate salts, perbromate persulfate salts, periodate persulfate salts, organic peroxy compounds such as peracetic acid, oxone, and the like.

The polishing composition can comprise any suitable amount of the oxidizing agent. The polishing composition can comprise about 1 ppm or more of the oxidizing agent, for example, about 5 ppm or more, about 25 ppm or more, about 50 ppm or more, about 75 ppm or more, or about 100 ppm or more. Alternatively, or in addition, the polishing composition can comprise about 2000 ppm or less of the oxidizing agent, for example, about 1500 ppm or less, about 1000 ppm or less, about 500 ppm or less, or about 250 ppm or less.

The polishing composition optionally further comprises hydrogen peroxide. The optional hydrogen peroxide can be present in any suitable amount in the polishing composition. For example, the polishing composition can comprise from about 0.1 wt. % to about 10 wt. % of hydrogen peroxide, e.g., about 0.5 wt. % to about 10 wt. %, or about 0.5 wt. % to about 5 wt. %.

The polishing composition optionally further comprises an organic phosphonic acid. The organic phosphonic acid can be any suitable organic phosphonic acid. Non-limiting examples of suitable organic phosphonic acids include 2-aminoethylphosphonic acid, 1-hydroxyethylidene-1,1-diphosphonic acid, aminotri(methylenephosphonic acid), ethylenediaminetetra(methylenephosphonic acid), diethylenetriaminepenta(methylenephosphonic acid), ethane-1,1-diphosphonic acid, ethane-1,1,2-triphosphonic acid, ethane-1-hydroxy-1,1-diphosphonic acid, ethane-1-hydroxy-1,1,2-triphosphonic acid, ethane-1,2-dicarboxy-1,2-diphosphonic acid, methanehydroxyphosphonic acid, 2-phosphonobutane-1,2-dicarboxylic acid, 1-phosphonobutane-2,3,4-tricarboxylic acid, α-methyl phosphonosuccinic acid, and combinations thereof.

The polishing composition can comprise any suitable amount of the organic phosphonic acid. The polishing composition can comprise about 0.01 wt. % or more of the organic phosphonic acid, for example, about 0.02 wt. % or more, about 0.03 wt. % or more, about 0.04 wt. % or more, about 0.05 wt. % or more, about 0.06 wt. % or more, about 0.07 wt. % or more, about 0.08 wt. % or more, about 0.09 wt. % or more, or about 0.1 wt. % or more of the organic phosphonic acid. Alternatively, or in addition, the polishing composition can comprise about 2 wt. % or less, for example, about 1.9 wt. % or less, about 1.8 wt. % or less, about 1.7 wt. % or less, about 1.6 wt. % or less, about 1.5 wt. % or less, about 1.4 wt. % or less, about 1.3 wt. % or less, about 1.2 wt. % or less, about 1.1 wt. % or less, or about 1 wt. % or less of the organic phosphonic acid. Thus, the polishing composition can comprise the organic phosphonic acid in a concentration bounded by any two of the aforementioned endpoints. For example, the polishing composition can contain about 0.01 wt. % to about 2 wt. % of the organic phosphonic acid, about 0.01 wt. % to about 1 wt. %, about 0.02 wt. % to about 1 wt. %, about 0.03 wt. % to about 1 wt. %, about 0.04 wt. % to about 1 wt. %, about 0.05 wt. % to about 0.5 wt. %, or about 0.1 wt. % to about 0.5 wt. %.

When the polishing composition comprises surface-coated alumina, desirably the organic phosphonic acid increases the removal rate of silicon oxide relative to tungsten when used to polish a substrate comprising silicon oxide and tungsten.

The polishing composition optionally further comprises an amino acid. The organic phosphonic acid can be any suitable amino acid. Non-limiting examples of suitable amino acids include glycine, alanine, lysine, and arginine.

The polishing composition has a pH of about 2 to about 6. Thus, the polishing composition can have a pH of about 2 or more, e.g., about 2.2 or more, about 2.4 or more, about 2.6 or more, about 2.8 or more, about 3.0 or more, about 3.2 or more, or about 3.4 or more. Alternatively, or in addition, the polishing composition can have a pH of about 6 or less, e.g., about 5.8 or less, about 5.6 or less, about 5.4 or less, about 5.2 or less, about 5 or less, about 4.8 or less, about 4.6 or less, about 4.4 or less, about 4.2 or less, or about 4.0 or less. Thus, the polishing composition can have a pH bounded by any two of the aforementioned endpoints. For example the polishing composition can have a pH of about 2 to about 6, e.g., about 2.2 to about 6, about 2.2 to about 5.8, about 2.4 to about 5.8, about 2.4 to about 5.6, about 2.4 to about 5.4, about 2.4 to about 5.2, about 2.6 to about 5.0, about 2.4 to about 4.8, about 2.4 to about 4.6, about 2.4 to about 4.4, about 2.4 to about 4.2, or about 2.4 to about 4.

The pH of the polishing composition can be adjusted using any suitable acid or base. Non-limiting examples of suitable acids include nitric acid, sulfuric acid, phosphoric acid, and organic acids such as formic acid and acetic acid. Non-limiting examples of suitable bases include sodium hydroxide, potassium hydroxide, and ammonium hydroxide.

The polishing composition optionally further comprises a buffering agent. The buffering agent can be any suitable buffering agent capable of maintaining the polishing composition at a pH as recited herein. Non-limiting examples of suitable buffering agents include formic acid, malonic acid, acetic acid, oxalic acid, citric acid, and phosphoric acid.

The chemical-mechanical polishing composition optionally further comprises one or more additives. Illustrative additives include conditioners, acids (e.g., sulfonic acids), complexing agents (e.g., anionic polymeric complexing agents), chelating agents, biocides, scale inhibitors, dispersants, and the like.

A biocide, when present, can be any suitable biocide and can be present in the polishing composition in any suitable amount. A suitable biocide is an isothiazolinone biocide. The amount of biocide in the polishing composition typically is about 1 ppm to about 500 ppm, preferably about 10 ppm to about 125 ppm.

The polishing composition can be prepared by any suitable technique, many of which are known to those skilled in the art. The polishing composition can be prepared in a batch or continuous process. Generally, the polishing composition can be prepared by combining the components thereof in any order. The term "component" as used herein includes individual ingredients (e.g., surface-coated abrasive, copolymer, oxidizing agent, optional hydrogen peroxide, optional organic phosphonic acid, optional amino acid, optional buffering agent, optional pH adjustor, etc.) as well as any combination of ingredients (e.g., surface-coated abrasive, copolymer, oxidizing agent, optional hydrogen peroxide, optional organic phosphonic acid, optional amino acid, optional buffering agent, optional pH adjustor, etc.).

For example, the abrasive can be dispersed in water. The copolymer, oxidizing agent, optional hydrogen peroxide, optional organic phosphonic acid, optional amino acid, optional buffering agent, and optional pH adjustor can then be added and mixed by any method that is capable of incorporating the components into the polishing composition. The oxidizing agent and/or optional hydrogen peroxide can be added at any time during the preparation of the polishing composition. Alternatively, the abrasive can be surface-coated with the copolymer separately, and the surface-coated abrasive either provided in water or dispersed in water, followed by addition of the oxidizing agent, optional hydrogen peroxide, optional organic phosphonic acid, optional amino acid, optional buffering agent, and optional pH adjustor and mixing by any method that is capable of incorporating the components into the polishing composition. The polishing composition can be prepared prior to use, with one or more components, such as the oxidizing agent and/or optional hydrogen peroxide, added to the polishing composition just before use (e.g., within about 1 minute before use, or within about 1 hour before use, or within about 7 days before use). The polishing composition also can be prepared by mixing the components at the surface of the substrate during the polishing operation.

The polishing composition can be supplied as a one-package system comprising surface-coated abrasive, oxidizing agent, optional hydrogen peroxide, optional organic phosphonic acid, optional amino acid, optional buffering agent, and optional pH adjustor and water. In another embodiment, the polishing composition can be supplied as a one-package system comprising the abrasive, copolymer, oxidizing agent, optional hydrogen peroxide, optional organic phosphonic acid, optional amino acid, optional buffering agent, and optional pH adjustor and water. Alternatively, the surface-coated abrasive can be supplied as a dispersion in water in a first container, and the oxidizing agent, optional hydrogen peroxide, optional organic phosphonic acid, optional amino acid, optional buffering agent, and optional pH adjustor and water can be supplied in a second container, either in dry form, or as a solution or dispersion in water. In an alternative embodiment, the abrasive can be supplied as a dispersion in water in a first container, and the copolymer, oxidizing agent, optional hydrogen peroxide, optional organic phosphonic acid, optional amino acid, optional buffering agent, and optional pH adjustor and water can be supplied in a second container, either in dry form, or as a solution or dispersion in water. The oxidizing agent and/or optional hydrogen peroxide desirably is supplied separately from the other components of the polishing composition and is combined, e.g., by the end-user, with the other components of the polishing composition shortly before use (e.g., 1 week or less prior to use, 1 day or less prior to use, 1 hour or less prior to use, 10 minutes or less prior to use, or 1 minute or less prior to use). The components in the first or second container can be in dry form while the components in the other container can be in the form of an aqueous dispersion. Moreover, it is suitable for the components in the first and second containers to have different pH values, or alternatively to have substantially similar, or even equal, pH values. Other two-container, or three or more-container, combinations of the components of the polishing composition are within the knowledge of one of ordinary skill in the art.

The polishing composition of the invention also can be provided as a concentrate which is intended to be diluted with an appropriate amount of water prior to use. In such an embodiment, the polishing composition concentrate can comprise the surface-coated abrasive, optional organic phosphonic acid, optional amino acid, optional buffering agent, and optional pH adjustor and water, with or without the oxidizing agent and/or optional hydrogen peroxide, in amounts such that, upon dilution of the concentrate with an appropriate amount of water, and the hydrogen peroxide if not already present in an appropriate amount, each component of the polishing composition will be present in the polishing composition in an amount within the appropriate range recited above for each component. In another embodiment, the polishing composition concentrate can comprise the abrasive, copolymer, optional organic phosphonic acid, optional amino acid, optional buffering agent, and optional pH adjustor and water, with or without the oxidizing agent and/or optional hydrogen peroxide, in amounts such that, upon dilution of the concentrate with an appropriate amount of water, and the hydrogen peroxide if not already present in an appropriate amount, each component of the polishing composition will be present in the polishing composition in an amount within the appropriate range recited above for each component. For example, the abrasive, copolymer, oxidizing agent, optional organic phosphonic acid, optional amino acid, optional buffering agent, and optional pH adjustor or the surface-coated abrasive, oxidizing agent, optional hydrogen peroxide, optional organic phosphonic acid, optional amino acid, optional buffering agent, and optional pH adjustor can each be present in the concentration in an amount that is about 2 times (e.g., about 3 times, about 4 times, or about 5 times) greater than the concentration recited above for each component so that, when the concentrate is diluted with an equal volume of water (e.g., 2 equal volumes of water, 3 equal volumes of water, or 4 equal volumes of water, respectively), along with the optional hydrogen peroxide in a suitable amount, each component will be present in the polishing composition in an amount within the ranges set forth above for each component. Furthermore, as will be understood by those of ordinary skill in the art, the concentrate can contain an appropriate fraction of the water present in the final polishing composition in order to ensure that other components are at least partially or fully dissolved in the concentrate.

The invention also provides a method of chemically mechanically polishing a substrate comprising (i) providing a substrate, (ii) providing a polishing pad, (iii) providing a chemical-mechanical polishing composition comprising (a) an abrasive selected from the group consisting of alumina, ceria, titania, zirconia, and combinations thereof, wherein the abrasive is surface-coated with a copolymer comprising a combination of sulfonic acid monomeric units and carboxylic acid monomeric units, or wherein the abrasive is surface-coated with a copolymer comprising a combination of sulfonic acid monomeric units and phosphonic acid monomeric units, (b) an oxidizing agent, and (c) water, wherein the polishing composition has a pH of about 2 to about 5, (iv) contacting the substrate with the polishing pad and the chemical-mechanical polishing composition, and (v) moving the polishing pad and the chemical mechanical polishing composition relative to the substrate to abrade at least a portion of the substrate to polish the substrate. Preferably, the substrate comprises at least one layer of tungsten or cobalt and at least one layer of silicon oxide on a surface of the substrate, and at least a portion of the tungsten or cobalt on a surface of the substrate and at least a portion of the silicon oxide on a surface of the substrate is abraded to thereby polish the substrate.

The chemical-mechanical polishing composition can be used to polish any suitable substrate and is especially useful for polishing substrates comprising at least one layer (typically a surface layer) comprised of tungsten or cobalt and at least one layer of silicon oxide. In an embodiment, the substrate further comprises silicon nitride (SiN). In an embodiment, the substrate further comprises titanium nitride (TiN), and at least a portion of the TiN on a surface of the substrate is abraded to thereby polish the substrate. In another embodiment, the substrate comprises at least one layer of tungsten, at least one layer of silicon oxide, at least one layer of SiN, and at least one layer of TiN.

The chemical-mechanical polishing composition is particularly suited for use in a post-polishing buffing step of substrates comprising tungsten or cobalt and silicon oxide. In certain embodiments, the substrate is prepared by forming surface features on substrates comprising, for example, a layer of silicon oxide on the surface of a silicon wafer. In some embodiments, the surface features are coated with a layer of a barrier material such as TiN (titanium nitride). Subsequently, the substrate surface is coated with a layer of circuit-forming material such as tungsten and/or cobalt, leaving an overburden of tungsten and/or cobalt filling the surface features. Initial polishing of the tungsten and/or cobalt overburden to expose the surface silicon oxide, thereby forming substrate circuit features comprising tungsten and/or cobalt filled lines separated by regions of silicon oxide, after which a buffing step can be performed to reduce surface defects resulting from the initial polishing step and to remove or reduce scratches and residue on the substrate surface. Erosion refers to the excessive removal of tungsten within the substrate features, leading to a non-planar surface topography. In order to minimize or even reduce erosion, a polishing composition must exhibit optimized material removal rates such that the removal of tungsten and/or cobalt from the substrate surface features and the removal of silicon oxide and/or SiN and/or TiN is balanced so as to result in optimized surface topography. The inventive polishing compositions exhibit removal rates for tungsten and/or cobalt and silicon oxide and/or SiN and/or TiN such that erosion is minimized in a buffing step.

The silicon oxide similarly can be any suitable silicon oxide, many forms of which are known in the art. Suitable types of silicon oxide include, but are not limited to, TEOS, borophosphosilicate glass (BPSG), PETEOS, thermal oxide, undoped silicate glass, and HDP oxide.

The chemical-mechanical polishing composition and method of the invention are particularly suited for use in conjunction with a chemical-mechanical polishing apparatus. Typically, the apparatus comprises a platen, which, when in use, is in motion and has a velocity that results from orbital, linear, or circular motion, a polishing pad in contact with the platen and moving with the platen when in motion, and a carrier that holds a substrate to be polished by contacting and moving the substrate relative to the surface of the polishing pad. The polishing of the substrate takes place by the substrate being placed in contact with the polishing pad and the polishing composition of the invention, and then the polishing pad moving relative to the substrate, so as to abrade at least a portion of a surface of the substrate to polish the substrate.

A substrate can be polished with the chemical-mechanical polishing composition using any suitable polishing pad (e.g., polishing surface). Suitable polishing pads include, for example, woven and non-woven polishing pads. Moreover, suitable polishing pads can comprise any suitable polymer of varying density, hardness, thickness, compressibility, ability to rebound upon compression, and compression modulus. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, coformed products thereof, and mixtures thereof. Soft polyurethane polishing pads are particularly useful in conjunction with the inventive polishing method. Typical pads include but are not limited to SURFIN™ 000, SURFIN™ SSW1, SPM3100 (commercially available from, for example, Eminess Technologies), POLITEX™, and Fujibo POLYPAS™ 27 (Fujibo H7000, H800, H600, H804 etc. not sure if these examples are really needed).

Desirably, the chemical-mechanical polishing apparatus further comprises an in situ polishing endpoint detection system, many of which are known in the art. Techniques for inspecting and monitoring the polishing process by analyzing light or other radiation reflected from a surface of the substrate being polished are known in the art. Such methods are described, for example, in U.S. Pat. Nos. 5,196,353, 5,433,651, 5,609,511, 5,643,046, 5,658,183, 5,730,642, 5,838,447, 5,872,633, 5,893,796, 5,949,927, and 5,964,643. Desirably, the inspection or monitoring of the progress of the polishing process with respect to a substrate being polished enables the determination of the polishing end-point, i.e., the determination of when to terminate the polishing process with respect to a particular substrate.

The following examples further illustrate the invention but, of course, should not be construed as in any way limiting its scope.

Example 1

This example demonstrates the colloidal stability over time of a polishing composition comprising a surface-coated zirconia abrasive and further comprising hydrogen peroxide, in accordance with an embodiment of the invention.

Polishing Composition 1A contained 5000 ppm of zirconia having a particle size of 180 nm surface-coated with an acrylic acid-2-acrylamido-2-methyl-1-propanesulfonic acid (AA-AMPS) copolymer, 1080 ppm of malonic acid, 500 ppm ferric nitrate, 1000 ppm of lysine, and 1000 ppm of arginine, adjusted to a pH of 3.0. Polishing Composition 1B contained the same components as Polishing Composition 1A and further contained 0.1 wt. % of Dequest™ 2010, which contains 1-hydroxyethylidene-1,1-diphosphonic acid.

0.5 wt. % of hydrogen peroxide was added to Polishing Compositions 1A and 1B. The particle size, surface zeta potential, and concentration of hydrogen peroxide were monitored over 7 days, with the hydrogen peroxide concentration being determined by titration with potassium permanganate. The particle size and surface zeta potential over time are shown graphically in FIG. 1. The hydrogen peroxide concentrations are shown graphically in FIG. 2.

Figure 2:
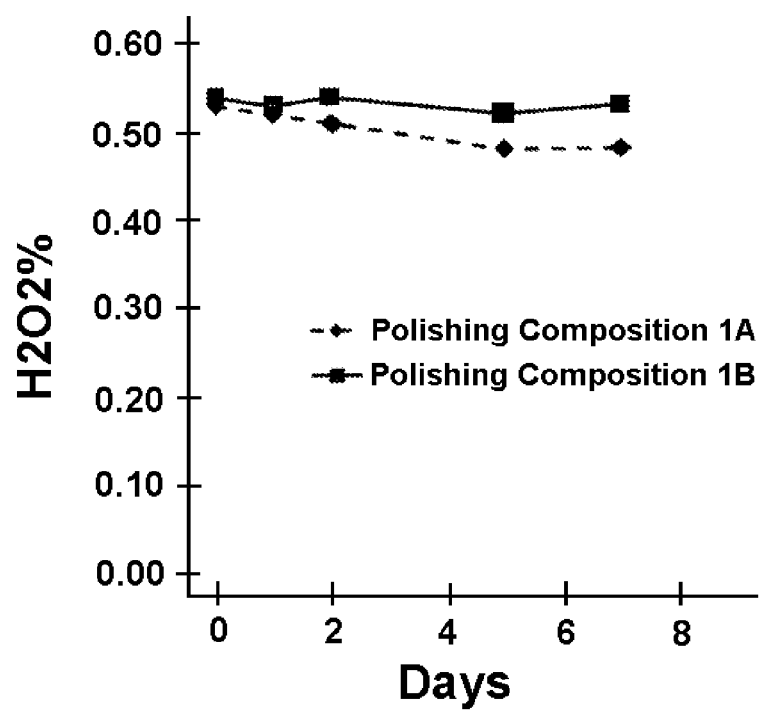
FIG. 2 shows the hydrogen peroxide levels of polishing compositions comprising surface-coated zirconia and hydrogen peroxide as a function of time, in accordance with an embodiment of the invention.

As is apparent from the results shown in FIGS. 1 and 2 for both Polishing Compositions 1A and 1B, the particle size, surface zeta potential, and hydrogen peroxide concentrations remained stable over 7 days.

Example 2

This example demonstrates the effect on erosion of buff polishing of tungsten-overcoated patterned silicon oxide-coated wafers with polishing compositions comprising alumina, zirconia, or cerium oxide abrasives surface-coated with a copolymer comprising a combination of sulfonic acid monomeric units and carboxylic acid monomeric units.

Polishing Compositions 2A-2C contained 1080 ppm of malonic acid, 500 ppm of ferric nitrate, 1000 ppm of lysine, and 1000 ppm of arginine, adjusted to a pH of 3.0. Polishing Compositions 2A-2C further contained 5000 ppm of alumina, zirconia, or cerium oxide surface-coated with an acrylic acid-2-acrylamido-2-methyl-1-propanesulfonic acid (AA-AMPS) copolymer, respectively.

Tungsten-overcoated patterned silicon oxide-coated wafers having 0.18×0.18 μm features were first polished using a Mirra tool with a Fujibo pad at 10.3 kPa downforce at a slurry flow rate of 150 mL/min. The patterned wafers were polished to 30% over-polish after the tungsten overburden was cleared. Next, the patterned wafers were buff polished with Polishing Compositions 2A-2C for 30 seconds. The erosion was measured before and after buff polishing, with the difference termed delta erosion. The results are set forth in Table 1.

TABLE 1

Delta Erosion as a Function of Type of Abrasive Particle

| Polishing Composition | Delta Erosion (Å) |
| --- | --- |
| 2A | 138 |
| 2B | 63 |
| 2C | −6 |

As is apparent from the results set forth in Table 1, Polishing Composition 2B, which contained zirconia surface-coated with AA-AMPS copolymer, exhibited a negative delta erosion that was approximately half the delta erosion exhibited by Polishing Composition 2B, which contained alumina surface-coated with AA-AMPS copolymer. Polishing Composition 2C, which contained cerium oxide surface-coated with AA-AMPS copolymer, exhibited a negative delta erosion of approximately −6 Å, indicating an improvement in erosion after buff polishing with Polishing Composition 2C.

Example 3

This example demonstrates the effect of an organic phosphonic acid on the removal rate of TEOS and silicon nitride exhibited by a polishing composition comprising alumina abrasive surface-coated with a copolymer comprising a combination of sulfonic acid monomeric units and carboxylic acid monomeric units.

Separate substrates comprising blanket layers of TEOS and silicon nitride (SiN) were polished with Polishing Compositions 3A and 3B. Polishing Compositions 3A and 3B contained 5000 ppm of alumina having a particle size of 180 nm surface-coated with an acrylic acid-2-acrylamido-2-methyl-1-propanesulfonic acid (AA-AMPS) copolymer, 1080 ppm of malonic acid, 500 ppm of ferric nitrate, 1000 ppm of lysine, and 1000 ppm of arginine, adjusted to a pH of 3.0. Polishing Composition 3B further contained 0.1 wt. % of Dequest™ 2010, which contains 1-hydroxyethylidene-1,1-diphosphonic acid (i.e., an organic phosphonic acid). After polishing, the removal rates for TEOS and SiN were determined. The results are set forth in Table 2.

TABLE 2

Effect of Organic Phosphonic Acid on TEOS and SiN Removal Rates

| Polishing Composition | TEOS Removal Rate (Å/min) | SiN Removal Rate (Å/min) |
| --- | --- | --- |
| 3A | 40 | 50 |
| 3B | 130 | 160 |

As is apparent from the results set forth in Table 2, Polishing Composition 3B, which contained an organic phosphonic acid, exhibited more than 3 times the removal rate for TEOS and more than 3 times the removal rate for SiN, compared to Polishing Composition 3A, which did not contain an organic phosphonic acid.

Example 4

This example demonstrates that an acrylic acid-2-acrylamido-2-methyl-1-propanesulfonic acid (AA-AMPS) copolymer forms a surface coating on alumina but not on silica. 10% aqueous dispersions of colloidal silica having average particles sizes of 50 nm, 100 nm, and 120 nm were mixed for 5 minutes at high shear with 1.6% of an AA-AMPS copolymer having a molecular weight of 24,000, using a Waring™ blender. The final pH of each dispersion was adjusted to 3.0. The resulting solutions were allowed to sit for 1 hour before centrifugation at about 80,000 g centrifugal force field. The supernatants were sampled and analyzed by chromatography for residual AA-AMPS. 100% of the AA-AMPS copolymer was recovered in the supernatant for each of the 50 nm, 100 nm, and 120 nm silica dispersions. When the same assay was done using alpha alumina having a particle size of 100 nm, only 70% of the AA-AMPS was recovered, while 30% of the AA-AMPS was found to be surface bound to the alumina particles.

Example 5

This example demonstrates a comparison of the colloidal stability of silica and alumina treated with an AA-AMPS copolymer.

10% aqueous dispersions of colloidal silica having average particles sizes of 50 nm, 100 nm, and 120 nm and a 10% aqueous dispersion of alpha alumina having a particle size of 100 nm were mixed for 5 minutes at high shear with 1.6% of an AA-AMPS copolymer having a molecular weight of 24,000 as described in Example 2. The dispersions were analyzed for particle size change using a Malvern particle sizing instrument after storage for 7 days at room temperature. The results, expressed as a percentage change from initial particle size of the untreated silica and alpha alumina, are set forth in Table 3.

TABLE 3

Colloidal Stability as a Function of Particle Type and Size

| Particle | Silica (50 nm) | Silica (100 nm) | Silica (120 nm) | Alumina (100 nm) |
| --- | --- | --- | --- | --- |
| Particle size increase vs. day 0 (%) | 32% | 39% | 414% | 0 |

As is apparent from the results set forth in Table 3, alumina particle size was completely stable in the presence of the AA-AMPS copolymer, while the silica experienced significant particle size growth. The treated silica dispersions additionally exhibited colloidal instability, while the treated alumina dispersion did not exhibit colloidal instability.

Example 6

This example demonstrates the effect on erosion of buff polishing of tungsten-overcoated patterned silicon oxide-coated wafers with polishing compositions comprising an alumina abrasive surface-coated with a copolymer comprising a combination of sulfonic acid monomeric units and carboxylic acid monomeric units.

Tungsten-overcoated patterned silicon oxide-coated wafers having 0.18×0.18 µm features were first polished using a Mirra tool with a Fujibo pad at 10.3 kPa downforce at a slurry flow rate of 150 mL/min. The patterned wafers were polished to 30% over-polish after the tungsten overburden was cleared. Next, the patterned wafers were buff polished with Polishing Compositions 6A and 6B for 30 seconds. Polishing Composition 6B contained 0.1 wt. % of Dequest™ 2010, which contains 1-hydroxyethylidene-1,1-diphosphonic acid (i.e., an organic phosphonic acid), while Polishing Composition 6A did not. The erosion was measured before and after buff polishing, with the difference termed delta erosion. The results are set forth in Table 4.

TABLE 4

| Delta Erosion as a Function of Organic Phosphonic Acid | |
|---|---|
| Polishing Composition | Delta Erosion (Å) |
| 3A | 135 |
| 3B | 40 |

As is apparent from the set forth in Table 4, Polishing Composition 6B, which contained alumina abrasive surface-treated with a copolymer comprising a combination of sulfonic acid monomeric units and carboxylic acid monomeric units and further contained an organic phosphonic acid, exhibited an approximately 3-fold lower delta erosion than that of Polishing Composition 6A, which did not contain containing an organic phosphonic acid.

Example 7

This example demonstrates the colloidal stability as a function of time of a polishing composition containing a surface-coated ceria abrasive alone.

The pH of an aqueous mixture containing 2 wt. % of ceria surface-coated with an AA-AMPS copolymer was adjusted from pH 2 to pH 12 in 1 unit increments. The particle size and zeta potential were measured. The results are shown graphically in FIG. 3.

Figure 3:
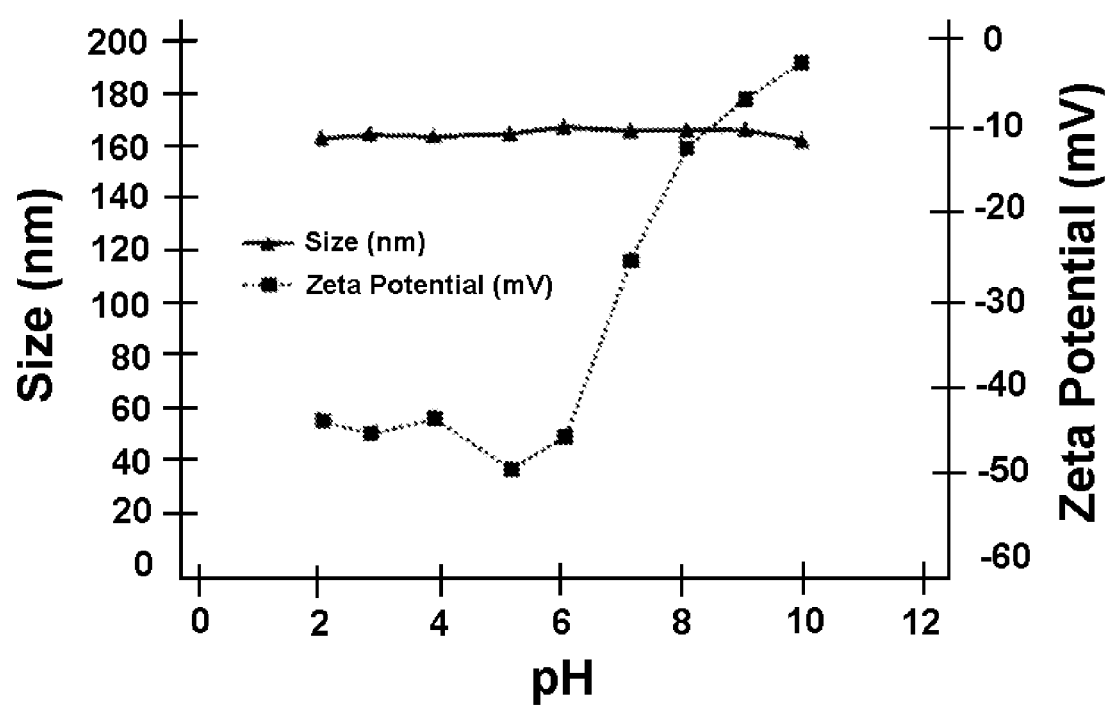
FIG. 3 shows the particle size and zeta potential of a dispersion of a surface-coated ceria abrasive as a function of pH.

As is apparent from the results shown in FIG. 3, the particle size remained roughly constant over the pH range of pH 2-10, while the zeta potential of the surface-coated abrasive particles ranged from approximately −50 mV to 0 mV. Thus, the surface-coated ceria exhibited good colloidal stability over a wide pH range.

Example 8

This example demonstrates the effect of an organic phosphonic acid on the removal rate of tungsten, TEOS, silicon nitride, and TiN exhibited by a polishing composition comprising an abrasive surface-coated with a copolymer comprising a combination of sulfonic acid monomeric units and carboxylic acid monomeric units.

Separate substrates comprising blanket layers of tungsten, TEOS, silicon nitride, and TiN were polished with Polishing Compositions 8A and 8B. Polishing Composition 8A contained 5000 ppm of ceria having a particle size of 120 nm surface-coated with an acrylic acid-2-acrylamido-2-methyl-1-propanesulfonic acid (AA-AMPS) copolymer, 1080 ppm of malonic acid, 500 ppm of ferric nitrate, 1000 ppm of lysine, and 1000 ppm of arginine, adjusted to a pH of 3.0. Polishing Composition 8B contained the same components as Polishing Composition 8A except that Polishing Composition 8B contained alumina surface-coated with AA-AMPS having a particle size of 180 nm [CONFIRM] instead of surface-coated ceria.

Following polishing, the removal rates for tungsten, TEOS, silicon nitride, and TiN were determined. The results are set forth in Table 5.

TABLE 5

| Removal Rates as a Function of Abrasive Particles | | | | |
|---|---|---|---|---|
| | Removal Rate (Å/min) | | | |
| Polishing Composition | W | SiO | SiN | TiN |
| 8A | 70 | 160 | 80 | 190 |
| 8B | 110 | 130 | 170 | 450 |

As is apparent from the results set forth in Table 5, Polishing Composition 8A, which contained ceria surface-coated with AA-AMPS, exhibited a TiN removal rate that was approximately 42% of the removal rate exhibited by Polishing Composition 8B. Polishing Composition 8A, which contained ceria surface-coated with AA-AMPS, exhibited a significantly lower TiN removal rate than that exhibited by Polishing Composition 8B, which contained alumina surface-coated with AA-AMPS, while maintaining a similar TEOS removal rate.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A chemical-mechanical polishing composition comprising:
   (a) an abrasive, wherein the abrasive is positively charged at the pH of the polishing composition prior to surface coating, selected from the group consisting of ceria, titania, zirconia, and combinations thereof, wherein the abrasive is surface-coated with a copolymer comprising a combination of sulfonic acid monomeric units and carboxylic acid monomeric units, or wherein the abrasive is surface-coated with a copolymer comprising a combination of sulfonic acid monomeric units and phosphonic acid monomeric units,
   (b) an oxidizing agent, and
   (c) water,
wherein the polishing composition has a pH of about 2 to about 5.

2. The polishing composition of claim 1, wherein the copolymer consists of 2-acrylamido-2-methylpropane sulfonic acid monomeric units and acrylic acid monomeric units.

3. The polishing composition of claim 1, wherein the polis composition further comprises an organic phosphonic acid selected from 2-aminoethylphosphonic acid, 1-hydroxyethylidene-1,1-diphosphonic acid, aminotri(methylenephosphonic acid), ethylenediaminetetra(methylenephosphonic acid), diethylenetriaminepenta(methylenephosphonic acid), ethane-1,1-diphosphonic acid, ethane-1,1,2-triphosphonic acid, ethane-1-hydroxy-1,1-diphosphonic acid, ethane-1-hydroxy-1,1,2-triphosphonic acid, ethane-1,2-dicarboxy-1,2-diphosphonic acid, methanehydroxyphosphonic acid, 2-phosphonobutane-1,2-dicarboxylic acid, 1-phosphonobutane-2,3,4-tricarboxylic acid, α-methyl phosphonosuccinic acid, and combinations thereof.

4. The polishing composition of claim 1, wherein the oxidizing agent comprises ferric ion.

5. The polishing composition of claim 4, wherein the oxidizing agent further comprises hydrogen peroxide and about 5 ppm to about 500 ppm ferric nitrate.

6. The polishing composition of claim 1, wherein the polishing composition further comprises an amino acid.

7. The polishing composition of claim 6, wherein the amino acid is glycine, lysine, arginine, or alanine.

8. The polishing composition of claim 1, wherein the polishing composition further comprises an amino acid.

9. The polishing composition of claim 8, wherein the amino acid is glycine, lysine, arginine, or alanine.

10. A chemical-mechanical polishing composition comprising:
    (a) an alumina abrasive, wherein the abrasive is positively charged at the pH of the polishing composition prior to surface coating, wherein the alumina is surface-coated with a copolymer comprising a combination of sulfonic acid monomeric units and carboxylic acid monomeric units, or wherein the abrasive is surface-coated with a copolymer comprising a combination of sulfonic acid monomeric units and phosphonic acid monomeric units,
    (b) an oxidizing agent, wherein the oxidizing agent comprises hydrogen peroxide and about 5 ppm to about 500 ppm ferric nitrate,
    (c) an organic phosphonic acid, wherein the organic phosphonic acid is selected from 2-aminoethylphosphonic acid, 1-hydroxyethylidene-1,1-diphosphonic acid, aminotri(methylenephosphonic acid), ethylenediaminetetra(methylenephosphonic acid), diethylenetriaminepenta(methylenephosphonic acid), ethane-1,1-diphosphonic acid, ethane-1,1,2-triphosphonic acid, ethane-1-hydroxy-1,1-diphosphonic acid, ethane-1-hydroxy-1,1,2-triphosphonic acid, ethane-1,2-dicarboxy-1,2-diphosphonic acid, methanehydroxyphosphonic acid, 2-phosphonobutane-1,2-dicarboxylic acid, 1-phosphonobutane-2,3,4-tricarboxylic acid, α-methyl phosphonosuccinic acid, and combinations thereof, and
    (d) water,
wherein the polishing composition has a pH of about 2 to about 5.

11. The polishing composition of claim 10, wherein the copolymer consists of 2-acrylamido-2-methylpropane sulfonic acid monomeric units and acrylic acid monomeric units.

12. A method of chemically mechanically polishing a substrate comprising:
    (i) providing a substrate, wherein the substrate comprises at least one layer of tungsten or cobalt and at least one layer of silicon oxide, and wherein at least a portion of the tungsten or cobalt and at least a portion of the silicon oxide is abraded to polish the substrate,
    (ii) providing a polishing pad,
    (iii) providing a chemical-mechanical polishing composition comprising:
        (a) an abrasive selected from the group consisting of alumina, ceria, titania, zirconia, and combinations thereof, wherein the abrasive is positively charged at the pH of the polishing composition prior to surface coating, wherein the abrasive is surface-coated with a copolymer comprising a combination of sulfonic acid monomeric units and carboxylic acid monomeric units, or wherein the abrasive is surface-coated with a copolymer comprising a combination of sulfonic acid monomeric units and phosphonic acid monomeric units,
        (b) an oxidizing agent, wherein the oxidizing agent comprises hydrogen peroxide and about 5 ppm to about 500 ppm ferric nitrate, and
        (c) water,
wherein the polishing composition has a pH of about 2 to about 5,
    (iv) contacting the substrate with the polishing pad and the chemical-mechanical polishing composition, and
    (v) moving the polishing pad and the chemical mechanical polishing composition relative to the substrate to abrade at least a portion of the substrate to polish the substrate.

13. The method of claim 12, wherein the copolymer consists of 2-acrylamido-2-methylpropane sulfonic acid monomeric units and acrylic acid monomeric units.

14. The method of claim 12, wherein the 2-acrylamido-2-methylpropane sulfonic acid monomeric units and acrylic acid monomeric units are in a molar ratio range of 10:1 to 1:10.

15. The method of claim 12, wherein the copolymer does not comprise acrylic ester monomeric units or monomeric units comprising aryl groups.

16. The method of claim 12, wherein the polishing composition further comprises an organic phosphonic acid selected from 2-aminoethylphosphonic acid, 1-hydroxyethylidene-1,1-diphosphonic acid, aminotri(methylenephosphonic acid), ethylenediaminetetra(methylenephosphonic acid), diethylenetriaminepenta(methylenephosphonic acid), ethane-1,1-diphosphonic acid, ethane-1,1,2-triphosphoric acid, ethane-1-hydroxy-1,1-diphosphonic acid, ethane-1-hydroxy-1,2-triphosphonic acid, ethane-1,2-dicarboxy-1,2-diphosphonic acid, methanehydroxyphosphonic acid, 2-phosphonobutane-1,2-dicarboxylic acid, 1-phosphonobutane-2,3,4-tricarboxylic acid, α-methyl phosphonosuccinic acid, and combinations thereof.

17. The method of claim 12, wherein the polish composition further comprises an amino acid.

18. The method of claim 17 wherein the amino acid is glycine, lysine, arginine, or alanine.

19. The method of claim 12, wherein the substrate further comprises TiN, and wherein at least a portion of the TiN is abraded to polish the substrate.

\* \* \* \* \*